US007123060B1

(12) United States Patent
Chen et al.

(10) Patent No.: US 7,123,060 B1
(45) Date of Patent: Oct. 17, 2006

(54) DRIVE CIRCUIT FOR A SWITCHING ELEMENT

(75) Inventors: Tien-Tzu Chen, Hsinchu (TW); Chia-Hung Tsen, Hsinchu County (TW)

(73) Assignee: Aimtron Technology Corp., Hsinchu (TW)

( * ) Notice: Subject to any disclaimer, the term of this patent is extended or adjusted under 35 U.S.C. 154(b) by 19 days.

(21) Appl. No.: 10/907,397

(22) Filed: Mar. 31, 2005

(51) Int. Cl.
H03B 1/00 (2006.01)

(52) U.S. Cl. ..................................... 327/108
(58) Field of Classification Search ............... 327/108, 327/112, 427, 434, 379; 326/82–83
See application file for complete search history.

(56) References Cited

U.S. PATENT DOCUMENTS

| | | | |
|---|---|---|---|
| 5,053,643 A | 10/1991 | Tanaka et al. ................. 326/30 |
| 5,939,907 A | 8/1999 | Miyazaki ..................... 327/108 |
| 6,130,575 A | 10/2000 | Nelson et al. .............. 327/540 |
| 6,545,513 B1 * | 4/2003 | Tsuchida et al. ............ 327/108 |
| 6,628,150 B1 * | 9/2003 | Carvajal et al. ............ 327/108 |

\* cited by examiner

Primary Examiner—My-Trang Nu Ton
(74) Attorney, Agent, or Firm—Winston Hsu

(57) ABSTRACT

A drive circuit applies a drive voltage through an outputs terminal to a switching element. The drive circuit includes a supplying circuit, an amplifying circuit, a detecting circuit, and an adjusting circuit. In response to a control signal, the supplying circuit generates a first drive current. The amplifying circuit generates and applies a second drive current, which is larger than the first drive current, to the output terminal for changing the drive voltage. The detecting circuit is coupled to the output terminal for generating a detection signal representative of the drive voltage. Based on the detection signal, the adjusting circuit implemented by a differential comparator dynamically adjusts the first drive current.

19 Claims, 5 Drawing Sheets

US 7,123,060 B1

DRIVE CIRCUIT FOR A SWITCHING ELEMENT

BACKGROUND OF THE INVENTION

1. Field of the Invention

The present invention relates to a drive circuit and, more particularly, to a high-speed and high-efficiency drive circuit for driving a switching element.

2. Description of the Related Art

FIG. 1 is a detailed circuit diagram showing a conventional drive circuit 10 for a switching element. The drive circuit 10 applies a drive voltage $V_O$ through an output terminal OUT to a switching element (not shown) to be driven. For example, the switching element may be implemented by an NMOS transistor or a PMOS transistor.

Referring to FIG. 1, when a control voltage $V_{IN}$ is at a low level state, a transistor Q1 is turned on and then supplies a current to a base electrode of a transistor Q3. As a result, the drive voltage $V_O$ is pulled up to become approximately equal to a supply voltage source $V_{cc}$ minus a collector-emitter saturation voltage $V_{CE,sat(Q3)}$ of the transistor Q3, i.e., $V_{CC}-V_{CE,sat(Q3)}$. If at this moment the drive voltage $V_O$ is applied to a gate electrode of an NMOS switching element, then the NMOS switching element can be turned on. When the control voltage $V_{IN}$ is at a high level state, a transistor Q2 is turned on and then supplies a current to a base electrode of a transistor A4. As a result, the drive voltage $Q_O$ is pushed down to become approximately equal to a collector-emitter saturation voltage $V_{CE,sat(Q4)}$ of the transistor Q4. If at this moment the drive voltage $V_O$ is applied to a gate electrode of an NMOS switching element, then the NMOS switching element can be turned off.

In order to provide a drive circuit with a higher operational speed and a better operational efficiency, a few of techniques and circuitry have already be developed and disclosed, for example, in U.S. Pat. No. 5,939,907 and U.S. Pat. No. 6,130,575, each of which is fully incorporated herein by reference.

SUMMARY OF THE INVENTION

An object of the present invention is to provide a drive circuit for a switching element, capable of achieving a high-speed driving operation.

Another object of the present invention is to provide a drive circuit for a switching element, capable of achieving a high-efficiency driving operation.

According to one aspect of the present invention, a drive circuit is provided for applying a drive voltage through an output terminal to a switching element. The drive circuit has a high-side drive unit and a low-side drive unit. In response to a high-side control signal, the high-side drive unit applies a high-side drive current to the output terminal for increasing the drive voltage. In response to a low-side control signal, the low-side drive unit applies a low-side drive current to the output terminal for decreasing the drive voltage.

The high-side drive unit has a high-side supplying circuit, a high-side amplifying circuit, a high-side detecting circuit, and a high-side adjusting circuit. The high-side supplying circuit generates a first high-side drive current in response to the high-side control signal. The high-side amplifying circuit generates a second high-side drive current based on the first high-side drive current and applies the second high-side drive current to the output terminal for increasing the drive voltage. The second high-side drive current is larger than the first high-side drive current. The high-side detecting circuit is coupled to the output terminal for generating a high-side detection signal representative of the high-side drive voltage. The high-side adjusting circuit is implemented by a high-side differential comparator for dynamically adjusting the first high-side drive current based on a comparison of the high-side detection signal and a predetermined high-side threshold voltage.

The low-side drive unit has a low-side supplying circuit, a low-side amplifying circuit, a low-side detecting circuit, and a low-side adjusting circuit. The low-side supplying circuit generates a first low-side drive current in response to the low-side control signal. The low-side amplifying circuit generates a second low-side drive current based on the first low-side drive current and applies the second low-side drive current to the output terminal for decreasing the drive voltage. The second low-side drive current is larger than the first low-side drive current. The low-side detecting circuit is coupled to the output terminal for generating a low-side detection signal representative of the low-side drive voltage. The low-side adjusting circuit is implemented by a low-side differential comparator for dynamically adjusting the first low-side drive current based on a comparison of the low-side detection signal and a predetermined low-side threshold voltage.

BRIEF DESCRIPTION OF THE DRAWINGS

The above-mentioned and other objects, features, and advantages of the present invention will become apparent with reference to the following descriptions and accompanying drawings, wherein.

DETAILED DESCRIPTION OF THE PREFERRED EMBODIMENTS

The preferred embodiments according to the present invention will be described in detail with reference to the drawings.

Figure 1:
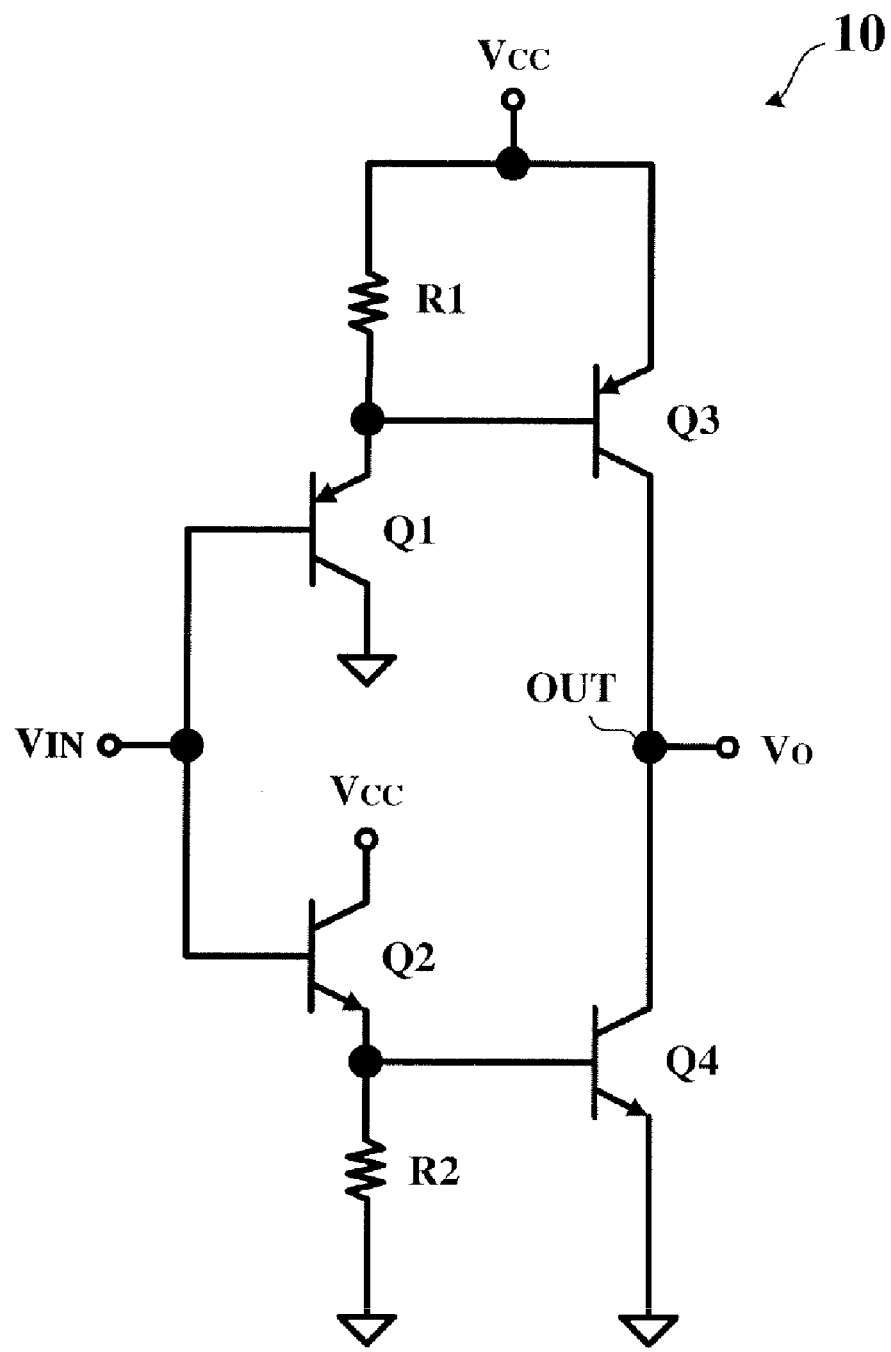
FIG. 1 is a detailed circuit diagram showing a conventional drive circuit for a switching element.
Figure 2:
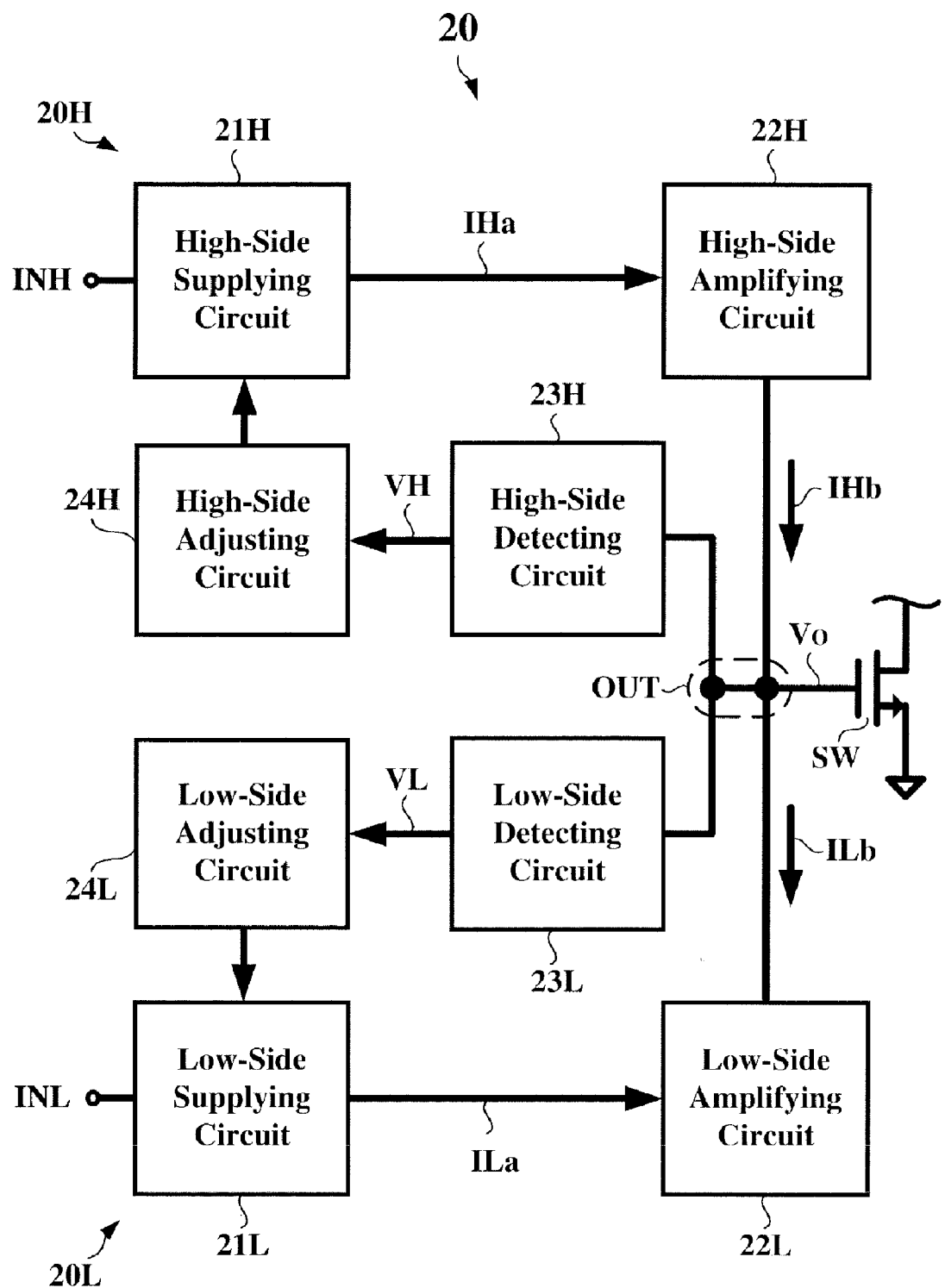
FIG. 2 is a circuit block diagram showing a drive circuit for a switching element according to the present invention.
Figure 3:
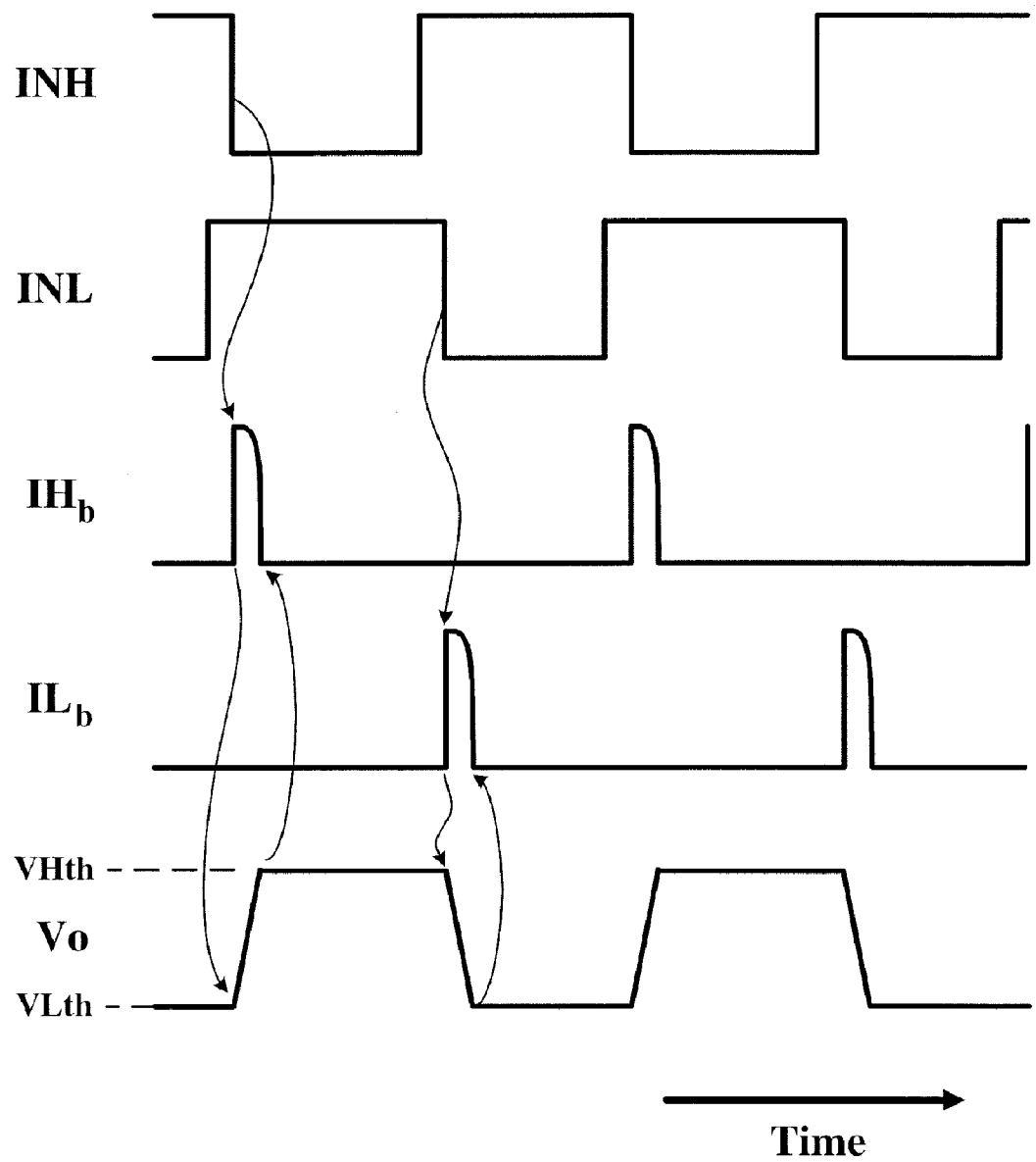
FIG. 3 is a waveform timing chart showing an operation of a drive circuit for a switching element according to the present invention.

FIG. 2 is a circuit block diagram showing a drive circuit 20 for a switching element SW according to the present invention. FIG. 3 is a waveform timing chart showing an operation of a drive circuit 20 for a switching element SW according to the present invention. As shown in FIG. 2, the drive circuit 20 according to the present invention is a combination of a high-side drive unit 20H and a low-side drive unit 20L. In response to a high-side control signal INH, the high-side drive unit 20H is activated to apply a high-level drive voltage $V_O$ through an output terminal OUT to the switching element SW. In a case where the switching element SW is implemented by an NMOS transistor, the high-level drive voltage $V_O$ is applied to turn on the switching element SW. In response to a low-side control signal INL, the low-side drive unit 20L is activated to apply a low-level drive voltage $V_O$ through the output terminal OUT to the switching element SW. In a case where the switching element SW is implemented by an NMOS transistor, the low-level drive voltage $V_O$ is applied to turn off the switching element SW. The activation of the high-side drive unit 20H by the high-side control signal INH should not be overlapped in time with the activation of the low-side drive unit 20L by the low-side control signal INL. Therefore, the control signals INH and INL effectively turn on/off the switching element SW through the is applied to turn off the switching element SW. The activation of the high-side drive circuit 20.

More specifically, the high-side drive unit 20H has a high-side supplying circuit 21H, a high-side amplifying circuit 22H, a high-side detecting circuit 23H, and a high-side adjusting circuit 24H. At first, the high-side control signal INH activates the high-side supplying circuit 21H to supply a high-side drive current $IH_a$. Based on the high-side drive current $IH_a$, the high-side amplifying circuit 22H generates a magnified high-side drive current $IH_b$ to be applied to the output terminal OUT. As a result, the magnified high-side drive current $IH_b$ causes the drive voltage $V_O$ to rise more rapidly and thus shortens the transient time of the switching element SW from off to on.

The high-side detecting circuit 23H is coupled to the output terminal OUT for generating a high-side detection signal VH representative of the drive voltage $V_O$. In response to the high-side detection signal VH, the high-side adjusting circuit 24H controls the high-side applying circuit 21H for dynamically adjusting the magnitude of the high-side drive current $IH_a$. More specifically, it is necessary for a relatively large drive current to speed up to the rising rate of the drive voltage $V_O$ at the beginning when the switching element SW starts approaching conductive from nonconductive. Under such circumstances, the high-side adjusting circuit 24H allows the high-side supplying circuit 21H to supply as much the high-side drive current $IH_a$ as possible. Once the drive voltage $V_O$ reaches or goes beyond a predetermined high-side threshold voltage $VH_{th}$, the drive voltage $V_O$ is considered to become large enough for definitely making the switching element SW conductive. Under such circumstance, the high-side adjusting circuit 24H prevents the high-side supplying circuit 21H from supplying any of the high-side drive current $IH_a$ to the high-side amplifying circuit 22H, thereby stopping the generation of the high-side drive current $IH_b$. Therefore, the high-side adjusting circuit 24H effectively saves the current consumption of the high-side drive unit 20H, achieving a high-efficiency driving operations.

More specifically, the low-side drive unit 20L has a low-side supplying circuit 21L, a low-side amplifying circuit 22L, a low-side detecting circuit 23L, and a low-side adjusting circuit 24L. At first, the low-side control signal INL activates the low-side supplying circuit 21L to supply a low-side drive current $IL_a$. Based on the low-side drive current $IL_a$, the low-side amplifying circuit 22L generates a magnified low-side drive current $IL_b$ to be applied to the output terminal OUT. As a result, the magnified low-side drive current $IL_b$ causes the drive voltage $V_O$ to fall more rapidly and thus shortens the transient time of the switching element SW from on to off.

The low-side detecting circuit 23L is coupled to the output terminal OUT for generating a low-side detection signal VL representative of the drive voltage $V_O$. In response to the low-side detection signal VL, the low-side adjusting circuit 24L controls the low-side applying circuit 21L for dynamically adjusting the magnitude of the low-side drive current $IL_a$. More specifically, it is necessary for a relatively large drive current to speed up the falling rate of the drive voltage $V_O$ at the beginning when the switching element SW starts approaching nonconductive from conductive. Under such circumstances, the low-side adjusting circuit 24L allows the low-side supplying circuit 21L to supply as much the low-side drive current $IL_a$ as possible. Once the drive voltage $V_O$ reaches or goes below a predetermined low-side threshold voltage $VL_{th}$, the drive voltage $V_O$ is considered to become small enough for definitely making the switching element SW nonconductive. Under such circumstance, the low-side adjusting circuit 24L prevents the low-side supplying circuit 21L from supplying any of the low-side drive current $IL_a$ to the low-side amplifying circuit 22L, thereby stopping the generation of the low-side drive current $IL_b$. Therefore, the low-side adjusting circuit 24L effectively saves the current consumption of the low-side drive unit 20L, achieving a high-efficiency driving operation.

Figure 4:
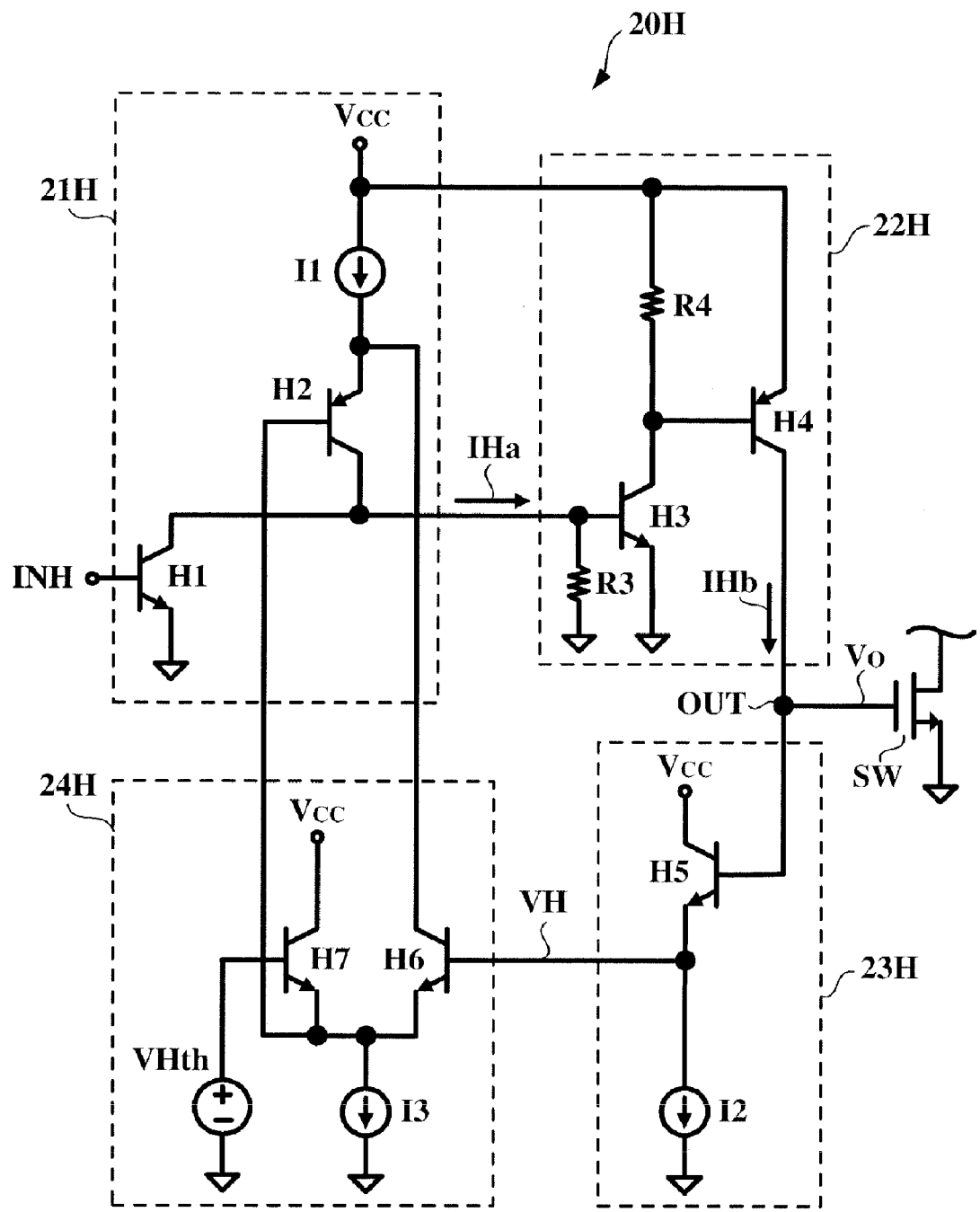
FIG. 4 is a detailed circuit diagram showing one example of a high-side drive unit according to the present invention.

FIG. 4 is a detailed circuit diagram showing one example of a high-side drive unit 20H according to the present invention. When the high-side control signal INH is at the low level state, a transistor H1 is turned off such that a current source I1 supplies a high-side drive current $IH_a$ through a transistor H2 to a base electrode of a transistor H3. The high-side drive current $IH_a$ is magnified with a factor of $\beta$ through the transistor H3 and then supplied to a base electrode of a transistor H4 to be magnified once again with another factor of $\beta$. Consequently, a magnified high-side drive current $IH_b$ supplied from a collector electrode of the transistor H4 is approximately equal to $\beta^2$ times the original high-side drive current $IH_a$. The magnified high-side drive current $IH_b$ causes the drive voltage $V_O$ to rise more rapidly and thus shortens the transient time of the switching element SW from off to on.

In the high-side detecting circuit 23H, a transistor H5 and a current source I2 are coupled to form a level shifter. The transistor H5 has a base electrode connected to the output terminal OUT for detecting the drive voltage $V_O$, and an emitter electrode for generating a high-side detection signal VH. Therefore, the high-side detection signal VH is equal to the drive voltage $V_O$ minus a base-emitter voltage $V_{BE(H5)}$ of the transistor H5.

The high-side adjusting circuit 24H is implemented by a differential comparator for comparing the high-side detection signal VH and a predetermined high-side threshold voltage $VH_{th}$. Based on such a comparison, the high-side adjusting circuit 24H dynamically adjusts the magnitude of the high-side drive current $IH_a$. More specifically, the high-side detection signal VH controls a base electrode of a transistor H6 while the high-side threshold voltage $VH_{th}$ controls a base electrode of a transistor H7. The transistors H6 and H7 have their emitter electrodes connected together to a current source I3. Following that the high-side detection signal VH becomes larger, the current source I3 distributes more current components through the current path formed by the transistor H6. Once the high-side detection signal VH goes beyond the high-side threshold voltage $VH_{th}$, the current supplied from the current source I3 completely flows through the current path formed by the transistor H6. Since a collector electrode of the transistor H6 is connected to the current source I1 of the high-side supplying circuit 21H, such the current sinking through the transistor H6 causes a drop in the high-side drive current $IH_a$, thereby achieving the dynamical adjustment of the high-side drive current $IH_a$ in accordance with the drive voltage $V_O$.

In one embodiment, the current source I3 is designed to be larger than or equal to the current source I1 such that the current supplied from the current source I1 is completely sunk through the transistor H6 and no more transferred as the high-side drive current $IH_a$ when the high-side detection signal VH goes beyond the high-side threshold voltage $VH_{th}$. Therefore, the high-side adjusting circuit 24H effectively saves the supply of the high-side drive current $IH_a$, achieving a high-efficiency driving operation. In another embodiment, the high-side threshold voltage $VH_{th}$ is designed to make a collector-emitter voltage $V_{CE(H4)}$ of the transistor H4 large enough for preventing the transistor H4 from operating into a deep saturation region, thereby keeping a fast response of the drive voltage $V_O$ upon transition.

After the high-side drive current $IH_a$ is stopped, a resistor R3 provides the transistor H3 with a discharge path while a resistor R4 provides the transistor H4 with another discharge path, thereby ensuring that the high-side amplifying circuit 22H is shut down. In addition, the transistor H2 is coupled to the transistor H6 such that a collector-emitter voltage $V_{CE(H6)}$ of the transistor H6 is set equal to emitter-base voltage $V_{EB(H2)}$ of the transistor H2, thereby ensuring that the transistor H6 is normally operated before the high-side detection signal VH goes beyond the high-side threshold voltage $VH_{th}$.

Figure 5:
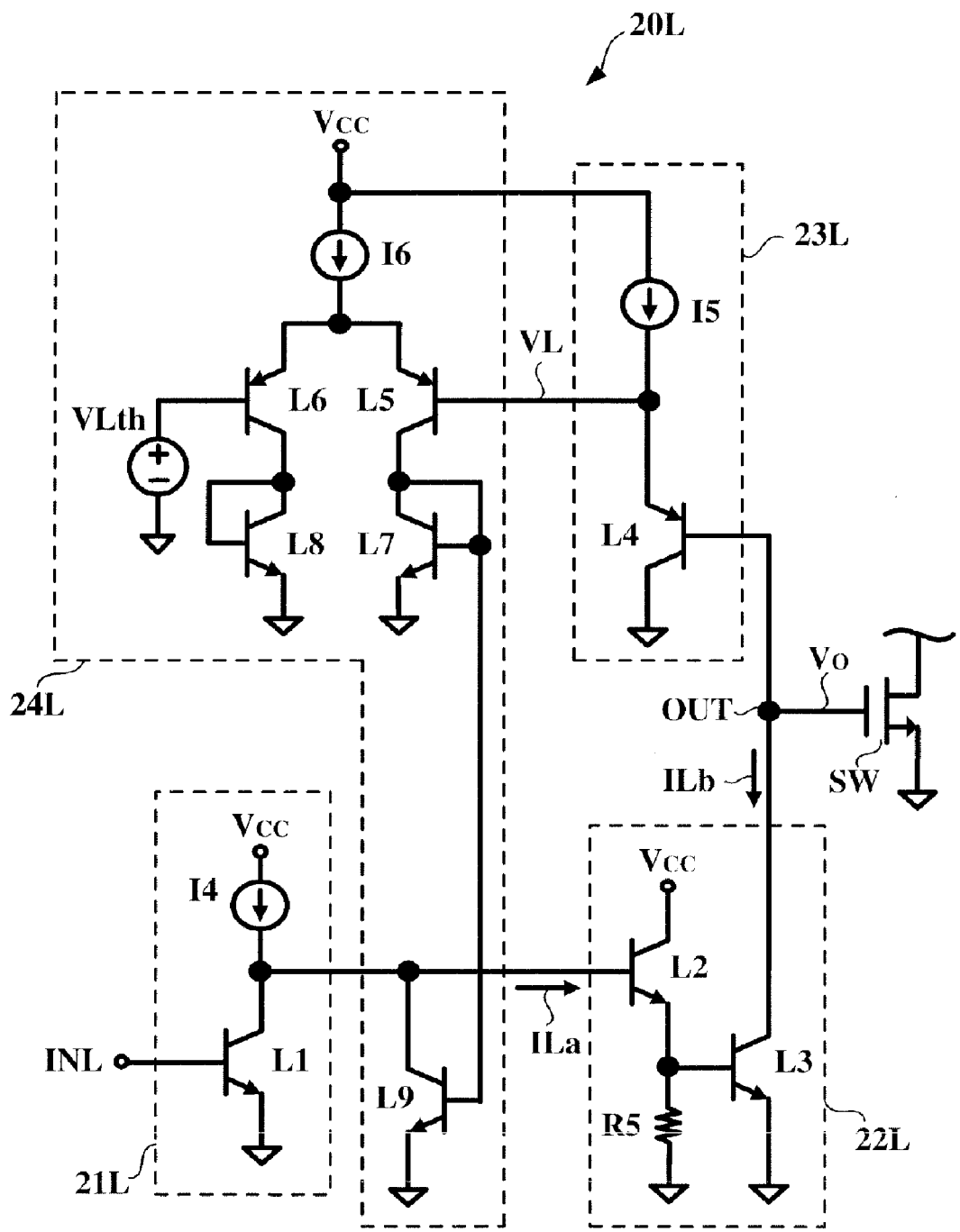
FIG. 5 is a detailed circuit diagram showing one example of a low-side drive unit according to the present invention.

FIG. 5 is a detailed circuit diagram showing one example of a low-side drive unit 20L according to the present invention. When the low-side control signal INL is at the low level state, a transistor L1 is turned off such that a current source I4 supplies a low-side drive current $IL_a$ to a base electrode of a transistor L2. The low-side drive current $IL_a$ is magnified with a factor of β through the transistor L2 and then supplied to a base electrode of a transistor L3 to be magnified once again with another factor of β. Consequently, a magnified low-side drive current $IL_b$ supplied from a collector electrode of the transistor L3 is approximately equal to $β^2$ times the original low-side drive current $IL_a$. The magnified low-side drive current $IL_b$ causes the drive voltage $V_O$ to fall more rapidly and thus shortens the transient time of the switching element SW from on to off.

In the low-side detecting circuit 23L, a transistor L4 and a current source I5 are coupled to form a level shifter. The transistor L4 has a base electrode connected to the output terminal OUT for detecting the drive voltage $V_O$, and an emitter electrode for generating a low-side detection signal VL. Therefore, the low-side detection signal VL is equal to the drive voltage $V_O$ plus an emitter-base voltage $V_{EB(L4)}$ of the transistor L4.

The low-side adjusting circuit 24L is implemented by a differential comparator for comparing the low-side detection signal VL and a predetermined low-side threshold voltage $VL_{th}$. Based on such a comparison, the low-side adjusting circuit 24L dynamically adjusts the magnitude of the low-side drive current $IL_a$. More specifically, the low-side detection signal VL controls a base electrode of a transistor L5 while the low-side threshold voltage $VL_{th}$ controls a base electrode of a transistor L6. Each of transistors L7 and L8 is diode-connected and provided as a load at respective collector electrodes of the transistors L5 and L6. The transistors L5 and L6 have their emitter electrodes connected together to a current source I6. Following that the low-side detection signal VL becomes smaller, the current source I6 distributes more current components through the current path formed by the transistor L5. Once the low-side detection signal VL goes below the low-side threshold voltage $VL_{th}$, the current supplied from the current source I6 completely flows through the current path formed by the transistor L5. Since a transistor L9 forms a current mirror with the transistor L7 and has a collector electrode connected to the current source I4 of the low-side supplying circuit 21L, such the current sinking through the transistor L9 causes a drop in the low-side drive current $IL_a$, thereby achieving the dynamical adjustment of the low-side drive current $IL_a$ in accordance with the drive voltage $V_O$.

In one embodiment, the current source I6 is designed to be larger than or equal to the current source I4 such that the current supplied from the current source I4 is completely sunk through the transistor L9 and no more transferred as the low-side drive current $IL_a$ when the low-side detection signal VL goes below the low-side threshold voltage $VL_{th}$. Therefore, the low-side adjusting circuit 24L effectively saves the supply of the low-side drive current $IL_a$, achieving a high-efficiency driving operation. In another embodiment, the low-side threshold voltage $VL_{th}$ is designed to make a collector-emitter voltage $V_{CE(L3)}$ of the transistor L3 large enough for the preventing the transistor L3 from operating into a deep saturation region, thereby keeping a fast response of the drive voltage $V_O$ upon transition. After the low-side drive current $IL_a$ is stopped, a resistor R5 provides the transistor L3 with a discharge path, thereby ensuring that the low-side amplifying circuit 22L is shut down.

While the invention has been described by way of examples and in terms of preferred embodiment, it is to understood that the invention is not limited to the disclosed embodiments. To the contrary, it is intended to cover various modifications. Therefore, the scope of the appended claims should be accorded the broadest interpretation so as to encompass all such modifications.

What is claimed is:

1. A drive circuit for applying a drive voltage through an output terminal to a switching element, comprising:
    a supplying circuit for generating a first drive current in response to a control signal;
    an amplifying circuit for generating a second drive current based on the first drive current and applying the second drive current to the output terminal for changing the drive voltage, wherein the second drive current is larger than the first drive current;
    a detecting circuit coupled to the output terminal for generating a detection signal representative of the drive voltage; and
    an adjusting circuit implemented by a differential comparator for dynamically adjusting the first drive current based on a comparison of the detection signal and a predetermined threshold voltage,
    wherein the differential comparator comprises:
        a first control terminal for receiving the detection signal;
        a second control terminal for receiving the threshold voltage;
        a first current path controlled by the first control terminal;
        a second current path controlled by the second control terminal; and
        a current source for distributing a predetermined adjustment current between the first current path and the second current path based on the comparison of the detection signal and the threshold voltage, wherein:
        the first current path is coupled to the supplying circuit for dynamically adjusting the first drive current.

2. The drive circuit according to claim 1, wherein:
    the adjustment current is designed to be larger than or equal to the first drive current.

3. The drive circuit according to claim 1, wherein:
    the adjusting circuit reduces the first drive current when the detection signal increases to approach the threshold voltage.

4. The drive circuit according to claim 3, wherein:
the adjusting circuit completely prevents the first drive current from being applied to the amplifying circuit when the detection signal goes beyond the threshold voltage.

5. The drive circuit according to claim 1, wherein:
the adjusting circuit reduces the first drive current when the detection signal decreases to approach the threshold voltage.

6. The drive circuit according to claim 5, wherein:
the adjusting circuit completely prevents the first drive current from being applied to the amplifying circuit when the detection signal goes below the threshold voltage.

7. The drive circuit according to claim 1, wherein:
the amplifying circuit applies the second drive current to the output terminal for increasing the drive voltage; and
the amplifying circuit comprises:
 a first transistor having a base electrode for receiving the first drive current, an emitter electrode coupled to a ground potential, and a collector electrode, and
 a second transistor having a base electrode coupled to the collector electrode of the first transistor, an emitter electrode coupled to a supply voltage source, and a collector electrode for supplying the second drive current to the output terminal.

8. The drive circuit according to claim 1, wherein:
the amplifying circuit applies the second drive current to the output terminal for decreasing the drive voltage, and
the amplifying circuit comprises:
 a first transistor having a base electrode for receiving the first drive current, an emitter electrode, and a collector electrode coupled to a supply voltage source, and
 a second transistor having a base electrode coupled to the emitter electrode of the first transistor, an emitter electrode coupled to a ground potential, and a collector electrode for applying the second drive current to the output terminal.

9. The drive circuit according to claim 1, wherein:
the detection circuit is implemented by a level shifter such that the detection signal is formed by shifting the drive voltage with a predetermined potential difference.

10. The drive circuit according to claim 9, wherein:
the predetermined potential difference is implemented by a base-emitter voltage of a transistor.

11. A drive circuit for applying a drive voltage through an output terminal to a switching element, comprising:
 a high-side supplying circuit for generating a first high-side drive current in response to a high-side control signal;
 a high-side amplifying circuit for generating a second high-side drive current based on the first high-side drive current and applying the second high-side drive current to the output terminal for increasing the drive voltage, wherein the second high-side drive current is larger than the first high-side drive current;
 a high-side detecting circuit coupled to the output terminal for generating a high-side detection signal representative of the high-side drive voltage;
 a high-side adjusting circuit implemented by a high-side differential comparator for dynamically adjusting the first high-side drive current based on a comparison of the high-side detection signal and a predetermined high-side threshold voltage;
 a low-side supplying circuit for generating a first low-side drive current in response to a low-side control signal;
 a low-side amplifying circuit for generating a second low-side drive current based on the first low-side drive current and applying the second low-side drive current to the output terminal for decreasing the drive voltage, wherein the second low-side drive current is larger than the first low-side drive current;
 a low-side detecting circuit coupled to the output terminal for generating a low-side detection signal representative of the low-side drive voltage; and
 a low-side adjusting circuit implemented by a low-side differential comparator for dynamically adjusting the first low-side drive current based on a comparison of the low-side detection signal and a predetermined low-side threshold voltage.

12. The drive circuit according to claim 11, wherein:
the high-side differential comparator comprises:
 a first high-side control terminal for receiving the high-side detection signal;
 a second high-side control terminal for receiving the high-side threshold voltage;
 a first high-side current path controlled by the first high-side control terminal;
 a second high-side current path controlled by the second high-side control terminal; and
 a high-side current source for distributing a predetermined high-side adjustment current between the first high-side current path and the second high-side current path based on the comparison of the high-side detection signal and the high-side threshold voltage, wherein:
the first high-side current path is coupled to the high-side supplying circuit for dynamically adjusting the first high-side drive current.

13. The drive circuit according to claim 12, wherein:
the high-side adjustment current is designed to be larger than or equal to the first high-side drive current.

14. The drive circuit according to claim 11, wherein:
the low-side differential comparator comprises:
 a first low-side control terminal for receiving the low-side detection signal;
 a second low-side control terminal for receiving the low-side threshold voltage;
 a first low-side current path controlled by the first low-side control terminal;
 a second low-side current path controlled by the second low-side control terminal; and
 a low-side current source for distributing a predetermined low-side adjustment current between the first low-side current path and the second low-side current path based on the comparison of the low-side detection signal and the low-side threshold voltage, wherein:
the first low-side current path is coupled to the low-side supplying circuit for dynamically adjusting the first low-side drive current.

15. The drive circuit according to claim 14, wherein:
the low-side adjustment current is designed to be larger than or equal to the first low-side drive current.

16. The drive circuit according to claim 11, wherein:
the high-side adjusting circuit reduces the first high-side drive current when the high-side detection signal increases to approach the high-side threshold voltage.

17. The drive circuit according to claim 16, wherein:
the high-side adjusting circuit completely prevents the first high-side drive current from being applied to the high-side amplifying circuit when the high-side detection signal goes beyond the high-side threshold voltage.

18. The drive circuit according to claim 11, wherein:
the low-side adjusting circuit reduces the first low-side drive current when the low-side detection signal decreases to approach the low-side threshold voltage.

19. The drive circuit according to claim 18, wherein:
the low-side adjusting circuit completely prevents the first low-side drive current from being applied to the low-side amplifying circuit when the low-side detection signal goes below the low-side threshold voltage.

\* \* \* \* \*